(12) United States Patent
Mertens et al.

(10) Patent No.: US 10,354,991 B2
(45) Date of Patent: Jul. 16, 2019

(54) INTEGRATED CIRCUIT WITH PROTECTION FROM TRANSIENT ELECTRICAL STRESS EVENTS AND METHOD THEREFOR

(71) Applicant: NXP USA, INC., Austin, TX (US)

(72) Inventors: Robert Matthew Mertens, Austin, TX (US); Michael A. Stockinger, Austin, TX (US); Alexander Paul Gerdemann, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/057,092

(22) Filed: Aug. 7, 2018

(65) Prior Publication Data

US 2018/0342498 A1 Nov. 29, 2018

Related U.S. Application Data

(62) Division of application No. 15/273,220, filed on Sep. 22, 2016, now Pat. No. 10,074,643.

(51) Int. Cl.
| | |
|---|---|
| *H01L 27/02* | (2006.01) |
| *H03K 19/20* | (2006.01) |
| *H01L 23/60* | (2006.01) |
| *H02H 9/04* | (2006.01) |

(52) U.S. Cl.
CPC .......... *H01L 27/0248* (2013.01); *H01L 23/60* (2013.01); *H01L 27/0285* (2013.01); *H02H 9/046* (2013.01); *H03K 19/20* (2013.01)

(58) Field of Classification Search
CPC ..... H01L 23/60; H01L 23/62; H01L 27/0248; H01L 27/0266; H01L 27/0285; H01L 27/0288; H01L 27/0292; H01L 29/66477; H01L 29/66568; H01L 29/78; H02H 9/046; H03K 19/215
See application file for complete search history.

(56) References Cited

U.S. PATENT DOCUMENTS

| | | | | |
|---|---|---|---|---|
| 6,970,336 | B2* | 11/2005 | Stockinger | H01L 27/0251 361/111 |
| 7,593,202 | B2* | 9/2009 | Khazhinsky | H02H 9/046 361/56 |
| 8,456,784 | B2* | 6/2013 | Stockinger | H01L 27/0292 361/56 |
| 8,634,174 | B2* | 1/2014 | Abou-Khalil | H02H 9/046 361/111 |
| 9,438,030 | B2* | 9/2016 | Stockinger | H03K 19/00315 |
| 2004/0125521 | A1* | 7/2004 | Salling | H01L 27/0285 361/56 |
| 2007/0247772 | A1* | 10/2007 | Keppens | H01L 27/0266 361/56 |
| 2009/0021872 | A1* | 1/2009 | Ker | H01L 27/0266 361/56 |

(Continued)

*Primary Examiner* — Stephen W Smoot

(57) ABSTRACT

An integrated circuit with protection against transient electrical stress events includes a trigger circuit having a first detection circuit coupled to a first supply voltage, a second detection circuit coupled to a second supply voltage, and a rail clamp device. During a first type of electrical stress event, the rail clamp device is activated in response to a first output signal provided by the first detection circuit. During a second type of electrical stress event, the rail clamp device is activated in response to a second output signal provided by the second detection circuit.

4 Claims, 4 Drawing Sheets

(56) References Cited

U.S. PATENT DOCUMENTS

| | | | | |
|---|---|---|---|---|
| 2014/0198415 A1* | 7/2014 | Schulmeyer | ............ | H02H 9/046 |
| | | | | 361/56 |
| 2015/0077886 A1* | 3/2015 | Chen | ................ | H02H 9/046 |
| | | | | 361/56 |
| 2015/0349522 A1* | 12/2015 | Miller | ................ | H05K 9/006 |
| | | | | 361/56 |
| 2016/0126729 A1* | 5/2016 | Gerdemann | ............ | H02H 9/046 |
| | | | | 361/56 |
| 2016/0181796 A1* | 6/2016 | Fifield | ............... | H01L 27/0285 |
| | | | | 361/56 |
| 2017/0229444 A1* | 8/2017 | Torres | ................ | H02H 9/041 |
| 2017/0302066 A1* | 10/2017 | Gao | ................ | H01L 27/0255 |

* cited by examiner

INTEGRATED CIRCUIT WITH PROTECTION FROM TRANSIENT ELECTRICAL STRESS EVENTS AND METHOD THEREFOR

BACKGROUND

Field

This disclosure relates generally to integrated circuits (ICs), and more specifically, to protection from transient electrical stress (TES) events for integrated circuits.

Related Art

Electronic circuits are designed to operate over limited voltage ranges. Exposure to voltages beyond those limited voltage ranges can damage or destroy those circuits. The problem is particularly notable for integrated circuits, which often have many external terminals connected to circuitry fabricated on a very small scale.

Transient voltage suppression circuits for integrated circuits should function for both unpowered transient events (i.e., those transient events occurring when the integrated circuit is not powered up for normal operation) and powered transient events (i.e., those transient events occurring when power is applied to the integrated circuit for normal operation). Unpowered TES events may include, but are not limited to, Electrostatic Discharge events (ESD), for example Human Body Model (HBM), Machine Model, or Charged Device Model (CDM) events. Powered TES events may include, but are not limited to, Powered ESD (PESD), Electric Fast Transient (EFT), Power Surge, or Ring Wave events.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
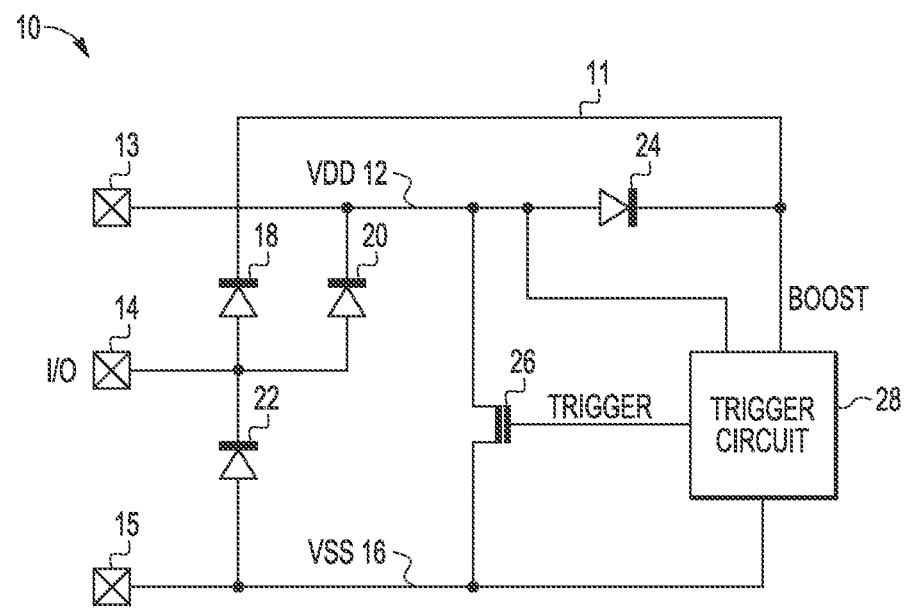
FIG. 1 illustrates, in partial schematic and partial block diagram form, an integrated circuit having TES event protection circuitry, in accordance with one embodiment of the present invention.

A transient electrical stress (TES) event refers to a fast rise in voltage at a net inside an electronic circuit which may result in damage or destruction of electronic circuits coupled to that net. Therefore, with TES event protection circuitry, a trigger circuit detects a transient voltage increase corresponding to a TES event, and, in response, places a clamping device into a conductive state to provide a current path to safely dissipate the associated stress current and to limit the transient voltage during the TES event. A large MOS device is often used as the clamping device between two supply rails, and the conductivity of the large MOS device is controlled by the trigger circuit. In many cases, an array of large MOS clamping devices is used with their gate terminals biased by a shared trigger circuit. During a TES event, it is desirable that the MOS clamping device does not reach its breakdown voltage as this may lead to the destruction of the clamping device and therefore cause permanent damage to the electronic circuit. However, in some applications, the normal operating voltage and the breakdown voltage of the MOS clamping device are very close, thus the design margin for the trigger circuit activating before the MOS device goes into breakdown is very tight, limiting the ability of the MOS device to operate as a clamping device.

Furthermore, in boosted designs of TES event protection circuitry, a separate (boosted) supply is used for powering the trigger circuit. All external pads, including I/O and power supply pads, are coupled to this boosted supply via pull-up diodes, ensuring that the boosted supply carries the highest possible potential. During normal operation of the electronic circuit, the boosted supply is typically charged up to the voltage level of the main power supply. If a TES event occurs on an I/O pin, the voltage on the boosted supply is elevated above the main power supply, which carries most of the TES current and connects to the drain terminal of the clamping device. Therefore, the trigger circuit can provide a gate voltage to the clamping device higher than the voltage on its drain. Overdriving the gate of the clamping device increases its on-conductance and therefore its TES protection efficiency. This improves design margins for TES events which occur on an I/O pad, resulting in a greater margin between the peak stress voltage and the breakdown voltage of the clamping device or any other device coupled to the stressed I/O pad (for example, input or output buffers) or coupled to the main power supply.

However, if the TES event occurs directly on the main power supply (i.e. at the drain of the clamping device), the supply voltage to the trigger circuit may be lower than the voltage across the clamping device, making the design margin of conventional boosted designs worse as compared to non-boosted designs. Furthermore, during a powered TES event on the main power supply, the overvoltage level on the main power supply needed to activate the trigger circuit via the boosted supply is higher as compared to non-boosted designs. This is because the boosted supply voltage is reduced by the pull-up diode from the main power supply. The resulting activation voltage for a TES event on the main power supply can be higher than the breakdown voltage of the clamping device, which may cause its destruction.

Therefore, as will be described below, a trigger circuit having multiple filters coupled to different supply voltages is used to activate the clamping device. In this manner, the trigger circuit can be designed to activate when any of the different supply voltages experiences a fast rising voltage ramp without causing damage to the electronic circuit. Furthermore, the TES event protection circuitry described below functions for both powered and unpowered transient events.

FIG. 1 illustrates an integrated circuit 10 having a boosted TES protection scheme. IC 10 includes a first power supply rail (VDD) 12, a first power supply pad 13 coupled to VDD 12, an I/O pad 14, a second power supply rail (VSS) 16, a second power supply pad 15 coupled to VSS 16, a boost bus 11, a trigger circuit 28, a clamping device 26, and diodes 18, 20, 22, and 24. In one embodiment, first power supply rail 12 may be a positive supply rail and second power supply rail may be a negative supply rail or ground. Clamping device 26 may be an N-channel metal oxide semiconductor field effect transistor (MOSFET or MOS transistor). Boost bus 11 is coupled to trigger circuit 28 to provide a third power supply BOOST to trigger circuit 28. Diode 22 has an anode coupled to VSS 16 and a cathode coupled to I/O pad 14, to an anode of diode 18. A cathode of diode 18 is coupled to boost bus 11. An anode of diode 20 is coupled to I/O pad 14, and a cathode of diode 20 is coupled to VDD 12. A first current electrode of clamping device 26 is coupled to VDD 12, a second current electrode of clamping device 26 is coupled to VSS 16, and a control electrode of clamping device 26 is coupled to receive a signal, TRIGGER, from trigger circuit 28. Trigger circuit 28 is also coupled to VDD 12 and VSS 16. An anode of diode 24 is coupled to VDD 12 and a cathode of diode 24 is coupled to boost bus 11.

In operation, circuits coupled to I/O pad 14 are protected by diodes, which shunt any TES current to VSS 16 or VDD 12, depending on the polarity of the TES event. Diode 22 conducts any TES current that leaves I/O pad 14. Diode 20 and clamping device 26 are the primary shunt path for TES current injected into I/O pad 14. During a stress event that injects current into I/O pad 14, trigger circuit 28 drives the control electrode of clamping device 26 to a voltage level needed for clamping device 26 to shunt the TES current between VDD 12 and VSS 16. During such stress event, a large TES current flows through VDD supply rail 12. Because of the resistive voltage drop in the VDD supply rail, the supply voltage will vary with position, i.e. it will decrease over distance to the stressed I/O pad. The supply voltage VDD will be highest at diode 20.

In the boosted protection scheme of FIG. 1, boost bus 11 is powered from I/O pad 14 during a TES event that injects current into I/O pad 14. Diode 18 and boost bus 11 are designed to have a lower resistive voltage drop than diode 20 and VDD supply rail 12 so that boost bus 11 can provide a higher supply voltage, at node BOOST, to trigger circuit 28. This is mainly due to the fact that there is little current flowing through diode 18 and boost bus 11 as they are not part of the primary TES current dissipation path. In this manner, a higher voltage is provided to the control electrode of clamping device 26 by the trigger circuit, allowing clamping device 26 to be made smaller to achieve a similar on-conductance compared to a non-boosted design where the trigger circuit would be powered directly by the VDD supply rail.

A drawback of this topology is that when TES current is injected directly onto VDD 12, boost bus 11 is powered from VDD 12, through diode 24. In general, the trigger circuit gets activated by a fast rising supply voltage that exceeds the activation voltage of the trigger circuit. The voltage drop in diode 24 reduces the supply voltage at node BOOST to trigger circuit 28 during a TES event. During normal, power-up operation of the electronic circuit, when no TES event is occurring, boost bus 11 is typically charged up to the voltage level of VDD 12. Therefore, the overvoltage on the VDD supply during a TES event needed to activate the trigger circuit though diode 24 is increased compared to a non-boosted design. However, by using separate filters in trigger circuit 28 powered separately by VDD 12 and BOOST, trigger circuit 28 can effectively provide TES protection when a TES event occurs on either VDD 12 or I/O pad 14.

Figure 2:
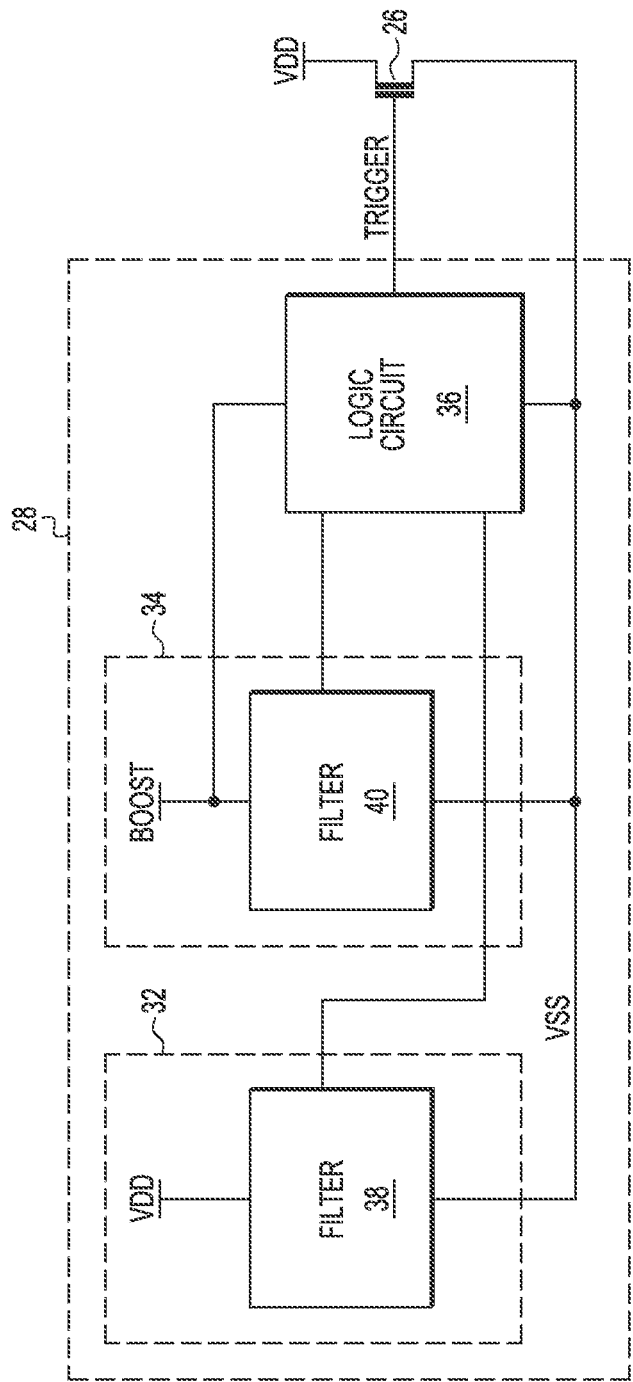
FIG. 2 illustrates, in partial schematic and partial block diagram form, one embodiment of a trigger circuit of TES event protection circuitry of FIG. 1.

FIG. 2 illustrates in partial schematic and partial block diagram form, trigger circuit 28 of FIG. 1. Trigger circuit 28 includes a resistor-capacitor (RC) timer 32, an RC timer 34, and a logic circuit 36. In the illustrated embodiment, RC timer 32 is implemented as a filter 38, and RC timer 34 is implemented as a filter 40. RC timers 32 and 34 may also be referred to as TES detection circuits, and they get activated by a fast rising voltage supply with a rise time that is within the range of the R*C time constant of the RC timers. Also illustrated in FIG. 2 is clamping device 26. Logic circuit 36 is coupled to BOOST (which may be coupled to boost bus 11) and VSS (which may be coupled to VSS 16). In some embodiments, logic circuit 36 may also be coupled to VDD (which may be coupled to VDD 12) in addition to BOOST and VSS. Logic circuit 36 has a first input coupled to filter 40, a second input coupled to filter 38, and an output coupled to provide a trigger signal on the TRIGGER node to the control electrode of clamping device 26. Filter 38 is coupled to VDD and VSS and provides an output to the second input of logic circuit 36. Filter 40 is coupled to BOOST and VSS and provides an output to the first input of logic circuit 36.

In operation, each filter 38 and 40 is coupled to a different voltage supply, VDD and BOOST, respectively. Therefore, the TRIGGER signal will be asserted to activate clamping device 26 when either supply experiences a fast rising voltage ramp above the activation voltage of the trigger circuit, due, for example, to a TES event. In this manner, with a boosted design where part of trigger circuit 28 is powered by a BOOST supply, trigger circuit 28 can be used to improve triggering for TES events at I/O pad 14 (in which BOOST is higher than VDD) without negatively impacting the trigger circuit activation for TES events at VDD (in which BOOST is lower than VDD). In the former case, trigger circuit 28 is activated via BOOST, and in the latter case, trigger circuit 28 is activated via VDD. Note that BOOST is typically charged up to VDD during normal operation (when a TES event is not occurring). However, during a TES event, BOOST is decoupled from VDD, and the logical combination of the outputs of filters 38 and 40 by logic circuit 36 determines the activation of clamping device 26. In one embodiment, logic circuit 36 effectively ORs the outputs of filters 38 and 40 to provide TRIGGER. In response to the assertion of TRIGGER, clamping device 26 is activated or turned on to shunt TES current between VDD and VSS. Specific examples of RC timers 32 and 34 and logic circuit 26 will be provided in FIGS. 3-6 below.

Figure 3:
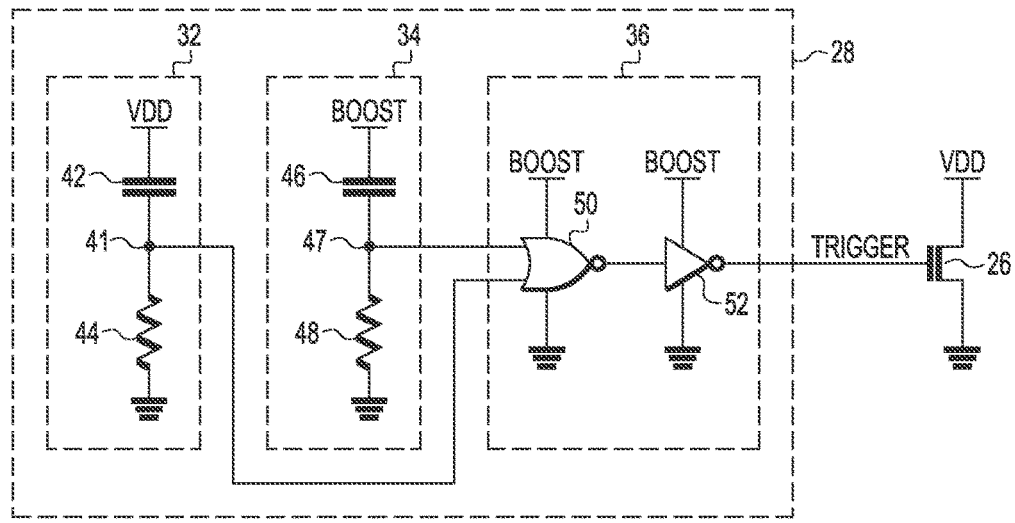
FIGS. 3-6 illustrate, in schematic form, further details of various embodiments of the trigger circuit of FIG. 2.

FIG. 3 illustrates, in schematic form, one embodiment of trigger circuit 28 coupled to provide TRIGGER to the control electrode of clamping device 26. RC timer 32 includes a capacitive element 42 and a resistive element 44. Capacitive element 42 has a first terminal coupled to VDD and a second terminal coupled to a circuit node 41, which provides an output of RC timer 32. Resistive element 44 has a first terminal coupled to node 41 and a second terminal coupled to VSS. (Note that in FIGS. 3-6, VSS is denoted with the ground symbol.) RC timer 34 includes a capacitive element 46 and a resistive element 48. Capacitive element 46 has a first terminal coupled to BOOST and a second terminal coupled to a circuit node 47, which provides an output of RC timer 34. Resistive element 48 has a first terminal coupled to node 47 and a second terminal coupled to VSS. Note that, as in FIG. 2, RC timers 32 and 34 are implemented as high pass filters in which RC timer 32 is a high pass filter with input coupled to VDD and RC timer 34 is a high pass filter with input coupled to BOOST. The use of high pass filters help to discriminate between a normal rise in VDD or BOOST (e.g. a normal power-up event) versus a fast stress event that is not normal, and which can result in damage of the electronic circuits coupled to VDD or BOOST.

Logic circuit 36 of FIG. 3 includes a NOR gate 50 and an inverter 52. Circuit node 41 (the output of RC timer 32) is coupled to a first input of NOR gate 50 and circuit node 47 (the output of RC timer 34) is coupled to a second input of NOR gate 50. An input of inverter 52 is coupled to an output of NOR gate 50 and an output of inverter 52 drives the control electrode of clamping device 26 via TRIGGER. Each of NOR gate 50 and inverter 52 is coupled to BOOST and VSS, therefore, these gates are powered by BOOST.

In operation, logic circuit 36 of FIG. 3 receives the output of both RC timers 32 and 34. Therefore, when RC timer 32 detects a rapid voltage rise on VDD, circuit node 41 increases, and when RC timer 34 detects a rapid voltage rise on BOOST, circuit node 47 increases. That is, each RC timer is a detection circuit of rapid voltage increases on corresponding voltage supply nodes, VDD and BOOST. Rapid voltage increase on VDD indicates a TES event on VDD 12 and rapid voltage increase on BOOST indicates a TES event on I/O pad 14. Initially, prior to any TES events, such as during normal operation, the output of NOR gate 50 is at logic level high (since circuit nodes 41 and 47 are low). This maintains clamping device 26 in an off state. However, the first of circuit nodes 41 and 47 to go higher than the trigger (or activation) point of NOR gate 50 (which is set relative to the voltage on BOOST) causes the output of NOR gate 50 to go low. This results in the output of inverter 52 going high and thus turning on (i.e. activating) clamping device 26 for the detected TES event.

Figure 4:
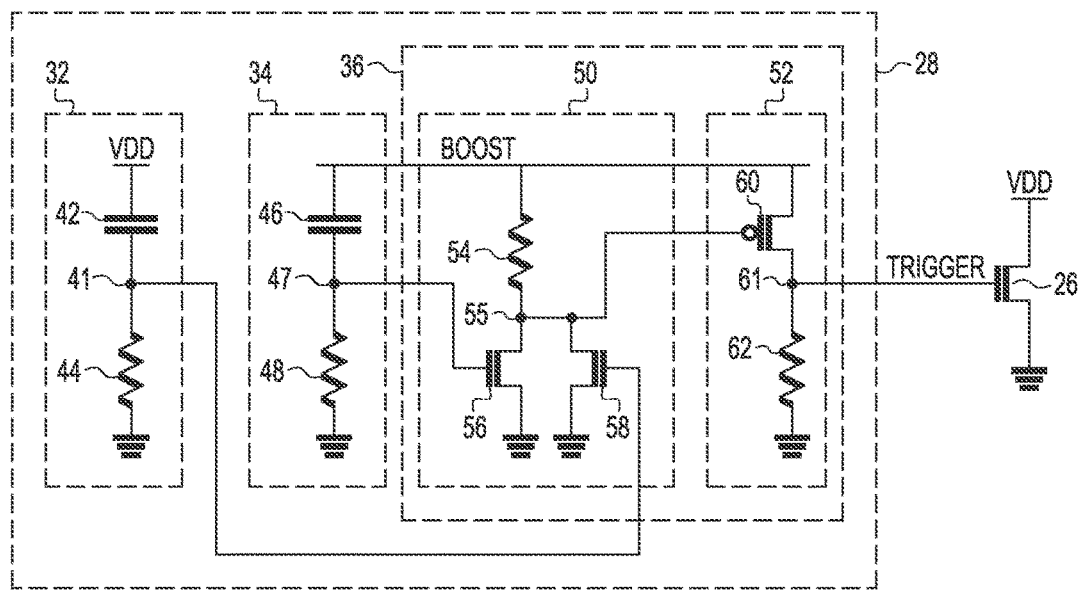

FIG. 4 illustrates, in schematic form, a more detailed representation of logic circuit 36 of FIG. 3. NOR gate 50 includes a ballast element 54 (shown in the form of a resistor), an N-channel MOS transistor 56, and an N-channel MOS transistor 58. A first terminal of ballast element 54 is coupled to BOOST and a second terminal of ballast element 54 is coupled to a circuit node 55 (which corresponds to the output of NOR gate 50). A first current electrode of transistor 56 is coupled to node 55, a second current electrode of transistor 56 is coupled to VSS, and a control electrode of transistor 56 (corresponding to the second input of NOR gate 50) is coupled to circuit node 47. A first current electrode of transistor 58 is coupled to node 55, a second current electrode of transistor 58 is coupled to VSS, and a control electrode of transistor 58 (corresponding to the first input of NOR gate 50) is coupled to node 41. Inverter 52 includes a P-channel transistor 60 and a ballast element 62 (shown in the form of a resistor). A first current electrode of transistor 60 is coupled to BOOST, a control electrode of transistor 60 is coupled to node 55, and a second current electrode is coupled to a circuit node 61. A first terminal of ballast element 62 is coupled to node 61 and a second terminal of ballast element 62 is coupled to VSS. Note 61 is coupled to the control electrode of clamping device 26.

Figure 5:
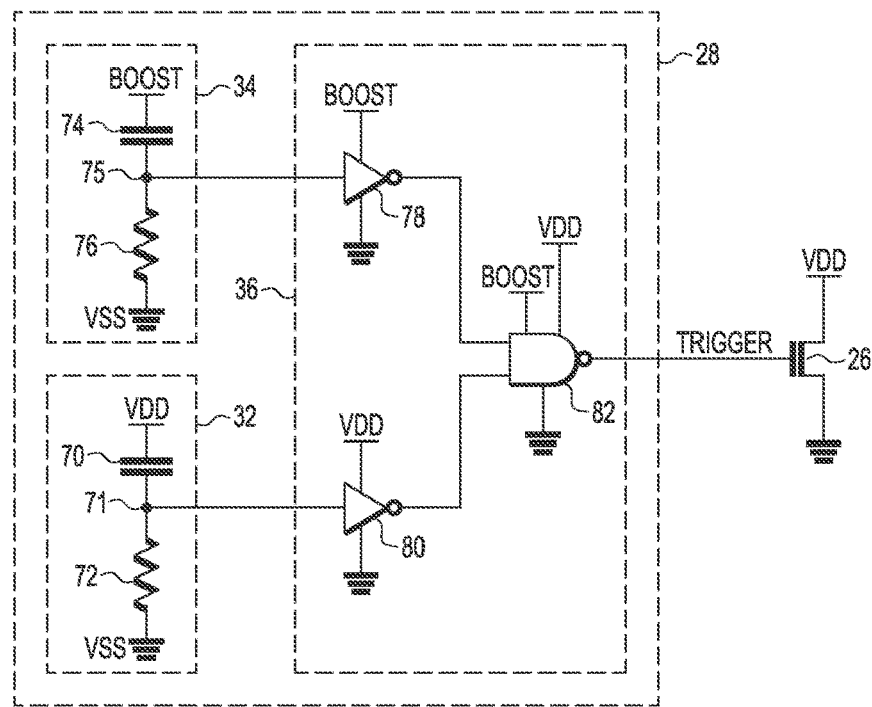

FIG. 5 illustrates in schematic form, another embodiment of trigger circuit 28 coupled to provide TRIGGER to the control electrode of clamping device 26. RC timer 32 includes a capacitive element 70 and a resistive element 72. Capacitive element 70 has a first terminal coupled to VDD and a second terminal coupled to a circuit node 71, which provides an output of RC timer 32. Resistive element 72 has a first terminal coupled to node 71 and a second terminal coupled to VSS. RC timer 34 includes a capacitive element 74 and a resistive element 76. Capacitive element 74 has a first terminal coupled to BOOST and a second terminal coupled to a circuit node 75, which provides an output of RC timer 34. Resistive element 76 has a first terminal coupled to node 75 and a second terminal coupled to VSS. Note that, as in FIGS. 2 and 3, RC timers 32 and 34 are implemented as high pass filters in which RC timer 32 is a high pass filter with input coupled to VDD and RC timer 34 is a high pass filter with input coupled to by BOOST.

Logic circuit 36 of FIG. 5 includes inverters 78 and 80 and a NAND gate 82. Circuit node 71 (the output of RC timer 32) is coupled to an input of inverter 80 and circuit node 75 (the output of RC timer 34) is coupled to an input of inverter 78. An output of inverter 78 is coupled to a first input of NAND gate 82, and an output of inverter 80 is coupled to a second input of NAND gate 82. An output of NAND gate 82 provides TRIGGER to the control electrode of clamping device 26. Inverter 78 is coupled to BOOST and VSS and therefore powered by BOOST, and inverter 80 is coupled to VDD and VSS and therefore powered by VDD. NAND gate 82 is coupled to BOOST, VDD, and VSS and therefore is partially powered by BOOST and partially powered by VDD, as will be seen in more detail in FIG. 6.

In operation, logic circuit 36 of FIG. 5 receives the output of both RC timers 32 and 34. Therefore, when RC timer 32 detects a rapid voltage rise on VDD, the voltage of circuit node 71 increases, and when RC timer 34 detects a rapid voltage rise on BOOST, the voltage of circuit node 75 increases. That is, each RC timer is a detection circuit of rapid voltage increases on corresponding voltage supplies, VDD and BOOST. As stated above, a rapid voltage increase on VDD indicates a TES event on VDD 12, and a rapid voltage increase on BOOST indicates a TES event on I/O pad 14. Initially, prior to any TES events, such as during normal operation, the outputs of inverters 78 and 80 are high, and thus the output of NAND gate 82 is low. This maintains clamping device 26 in an off state. However, the first of circuit nodes 71 and 75 to go higher than the trigger (or activation) point of the respective inverter 80 or 78 causes the output of that inverter to go low thus causing the output of NAND gate 82 to go high. This results in turning on (i.e. activating) clamping device 26 for the detected TES event.

Figure 6:
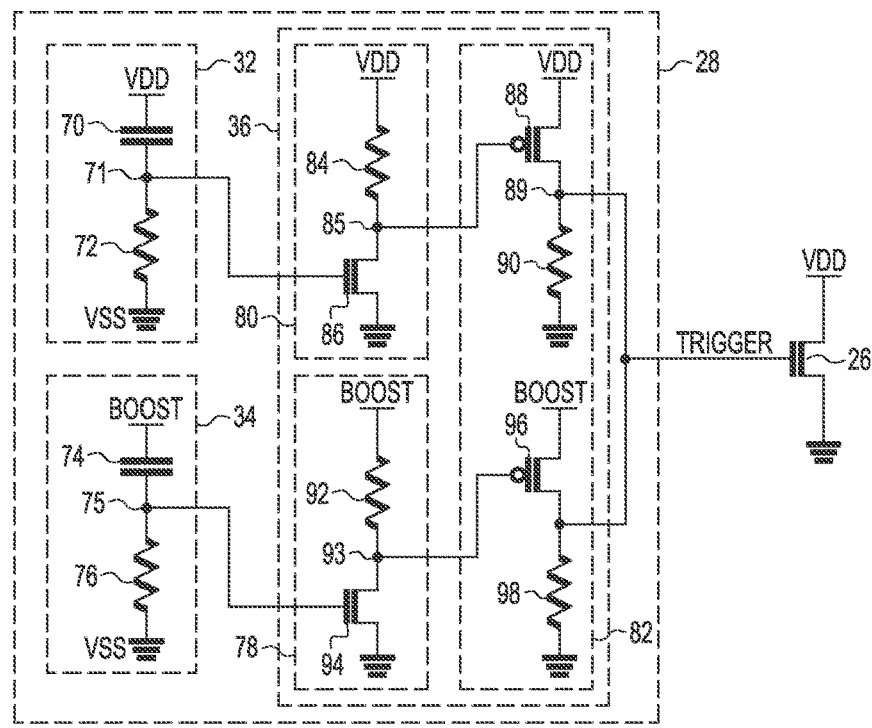

FIG. 6 illustrates, in schematic form, a more detailed representation of logic circuit 36 of FIG. 5. Inverter 80 includes a ballast element 84 (shown in the form of a resistor) and an N-channel MOS transistor 86. A first terminal of ballast element 84 is coupled to VDD, and a second terminal of ballast element 84 is coupled to a circuit node 85, which corresponds to the output of inverter 80. A first current electrode of transistor 86 is coupled to node 85, a second current electrode of transistor 86 is coupled to VSS, and a control electrode of transistor 86 is coupled to circuit node 71 and corresponds to the input of inverter 80. Inverter 78 includes a ballast element 92 (shown in the form of a resistor) and an N-channel MOS transistor 94. A first terminal of ballast element 92 is coupled to BOOST, and a second terminal of ballast element 92 is coupled to a circuit node 93, which corresponds to the output of inverter 78. A first current electrode of transistor 94 is coupled to node 93, a second current electrode of transistor 94 is coupled to VSS, and a control electrode of transistor 94 is coupled to circuit node 75 and corresponds to the input of inverter 78. NAND gate 82 includes P-channel MOS transistors 88 and 96 and ballast elements 90 and 98 (shown in the form of resistors). A first current electrode of transistor 88 is coupled to VDD, a second current electrode of transistor 88 is coupled to a circuit node 89, and a control electrode of transistor 88 is coupled to node 85 and corresponds to the second input of NAND gate 82. A first terminal of ballast element 90 is coupled to node 89, which corresponds to the output of NAND gate 82, and a second terminal of ballast element 90 is coupled to VSS. A first current electrode of transistor 96 is coupled to BOOST, a second current electrode of transistor 96 is coupled to a circuit node 89, and a control electrode of transistor 96 is coupled to node 93 and corresponds to the first input of NAND gate 82. A first terminal of ballast element 98 is coupled to node 89, which corresponds to the output of NAND gate 82, and a second terminal of ballast element 98 is coupled to VSS.

The trigger circuits of FIGS. 3 and 4 have their logic circuit 36 powered solely by the BOOST supply. This means that the gate voltage of the clamping device would be limited to the BOOST voltage during a TES event occurring on VDD, and the BOOST voltage is typically lower than the VDD voltage for such an event. However, the main benefit of these trigger circuits, which is a reduced trigger activation voltage for such a TES event, is still effective due to the additional detection stage powered by VDD. The trigger circuits of FIGS. 5 and 6, on the other hand, have their logic circuit 36 powered by VDD and BOOST and are therefore capable of driving the gate of the clamping device to either the VDD or the BOOST voltage, depending on whether the TES event is detected on VDD or BOOST, respectively. Therefore, these trigger circuits may also be able to provide a higher maximum gate voltage to the clamping device during a TES event on VDD, in addition to the benefit of a reduced trigger activation voltage.

In alternate embodiments, different circuit elements or configurations may be used for trigger circuit 28. For example, resistive element 44, 48, 72, and 76 can be implemented with one or more resistive elements in series or in parallel. In one embodiment, resistive elements 44, 48, 72, and 76 can be implemented with a resistive ladder or resistive pull-down network with a programmable resistive value in which the resistance can be set depending on the operating state of IC 10. While ballast elements 54, 62, 84, 90, 92, and 98 described above are shown as resistors in the embodiments of FIGS. 4 and 6, other devices may be used, such as, for example, complementary MOS transistors or other types of resistive elements. Also, in an alternate embodiment, the positions of the capacitive element and resistive element in filters 32 and 34 can be reversed, and logic circuit 36 may include a different number of logic gate stages (e.g. one or more), such as inverter stages. In another alternate embodiment, a P-channel MOS device can be used as clamp device 26 rather than an N-channel MOS device. Also, different logic gates may be used to implement the logic function of logic circuit 36. Similarly, different circuit configurations can be used to implement the logic gates of logic circuit 36 in which logic circuit 36 activates clamping device 26 upon the detection of a TES event either on VDD or BOOST.

Therefore, by now it can be understood how the use of two separate RC filters coupled to different power supply voltages can be used to provide a protection system which is effective for protecting against TES events on both VDD and I/O pads. In this manner, the benefits of a boosted design can be achieved, such as higher design margins, while still effectively detecting TES events on VDD. Furthermore, the protection circuits described herein protect against both powered and unpowered TES events.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Those skilled in the art will recognize that boundaries between the functionality of the above described blocks and operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different detection circuits can be used in place of RC timers 32 and 34, which are powered by the different voltage supplies, such as other high pass filters or Zener voltage sensing circuits. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit for protecting against transient electrical stress events includes a trigger circuit including a first detection circuit coupled to a first supply voltage; a second detection circuit coupled to a second supply voltage; a rail clamp device, wherein during a first type of electrical stress event, the rail clamp device is activated in response to a first output signal provided by the first detection circuit, and during a second type of electrical stress event, the rail clamp device is activated in response to a second output signal provided by the second detection circuit. In one aspect, the first detection circuit includes a first capacitive element coupled in series with a first resistive element between the first supply voltage and a third supply voltage, and an output terminal between the first capacitive element and the first resistive element provides the first output signal, and the second detection circuit includes a second capacitive element coupled in series with a second resistive element between the second supply voltage and the third supply voltage, and an output terminal between the second capacitive element and the second resistive element provides the second output signal. In another aspect, the integrated circuit further includes a combinatorial logic circuit coupled between the first and second detection circuits and the rail clamp device, wherein the combinatorial logic circuit is configured to receive the first output signal of the first detection circuit and the second output signal of the second detection circuit, and generate a third output signal that activates the rail clamp device when the first or second output signals of the first or second detection circuits detect an electrical stress event. In a further aspect, the combinatorial logic circuit includes a NOR gate having a first input coupled to the first output signal of the first detection circuit and a second input coupled to the second output signal of the second detection circuit. In another further aspect, the combinatorial logic circuit further includes an inverter having an input coupled to an output of the NOR gate and an output configured to control the rail clamp device. In yet another further aspect, the NOR gate includes a first ballast element including a first terminal coupled to the second supply voltage and a second terminal; a first metal-oxide semiconductor (MOS) transistor including a first current electrode coupled to the second terminal of the first resistive element, a second current electrode coupled to a third voltage supply and a gate electrode coupled to the output signal of the second detection circuit; and a second MOS transistor including a first current electrode coupled to the second terminal of the first resistive element, a second current electrode coupled to the third voltage supply and a gate electrode coupled to the output signal of the first detection circuit. In yet a further aspect, the inverter includes a third MOS transistor having a first current electrode coupled to the second supply voltage, a second current electrode coupled to a first terminal of a second ballast element, and a gate electrode coupled to the first current electrodes of the first and second MOS transistors; and the second resistive element includes a second terminal coupled to the third voltage supply. In another aspect, the integrated circuit further includes a combinatorial logic circuit including a first inverter including an input coupled to the first output signal of the first detection circuit; a second inverter including an input coupled to the second output signal of the second detection circuit; and a NAND gate that generates a third output signal, wherein the NAND gate includes a first input configured to receive an output signal from the first inverter, and a second input configured to receive an output signal from the second inverter. In yet a further aspect, the first inverter includes a third ballast element coupled in series with a first MOS transistor between the first supply voltage and the third supply voltage, wherein a gate electrode of the first MOS transistor is coupled to the first output signal, and the second inverter includes a fourth ballast element coupled in series with a second MOS transistor between the second supply voltage and the third supply voltage, wherein a gate electrode of the second MOS transistor is coupled to the second output signal. In yet an event further aspect, the NAND gate includes a third inverter including a fifth ballast element coupled in series with a third MOS transistor between the first supply voltage and the third supply voltage, wherein a gate electrode of the third MOS transistor is coupled to the output signal from the first inverter, and the fourth inverter includes a sixth ballast element coupled in series with a fourth MOS transistor between the second supply voltage and the third supply voltage, wherein a gate electrode of the fourth MOS transistor is coupled to the output signal from the second inverter.

In another embodiment, a method includes detecting a first type of electrical stress event with a first detection circuit in a trigger circuit, wherein the first detection circuit is coupled to a first supply voltage; when the first type of electrical stress event is detected, activating a rail clamp device to protect an integrated circuit from the first type of transient electrical stress event; detecting a second type of electrical stress event with a second detection circuit in the trigger circuit, wherein the second detection circuit is coupled to a second supply voltage; and when the second type of electrical event is detected, activating the rail clamp device to protect the integrated circuit from the second type of transient electrical stress event. In one aspect, the method further includes generating an output signal with a combinatorial logic circuit coupled to receive input from the first and second detection circuits, and to provide the output signal to activate the rail clamp device based on the input from the first and second detection circuits. In another aspect, the method further includes receiving an output signal from the first detection circuit at an input to a NOR gate; receiving an output signal from the second detection circuit at another input to the NOR gate; receiving an output signal from the NOR gate at an input to an inverter; activating the rail clamp device with an output of the inverter. In another aspect, the method further includes receiving an output signal from the first detection circuit at an input to a first inverter; receiving an output signal from the second detection circuit at an input to a second inverter; receiving an output signal from the first inverter at an input to a NAND gate; receiving an output signal from the second inverter at another input to the NAND gate; activating the rail clamp device with an output of the NAND gate.

In another embodiment, an integrated circuit for protecting against transient electrical stress events includes a trigger circuit including a first resistive-capacitive (RC) filter coupled to a first supply voltage; a second RC filter coupled to a second supply voltage; combinatorial logic circuit configured to receive an output signal from the first RC filter, receive an output signal from the second RC filter, and generate an output signal that activates a rail clamp device when the output signal from the first or second RC filters indicate an electrical stress event. In one aspect, the combinatorial logic circuit includes a NOR gate having a first input coupled to the output signal of the first RC filter and a second input coupled to the output signal of the second RC filter. In a further aspect, the combinatorial logic circuit further includes an inverter having an input coupled to an output of the NOR gate and an output configured to control the rail clamp device. In yet a further aspect, the NOR gate includes a first ballast element including a first terminal coupled to the second supply voltage and a second terminal; a first metal-oxide semiconductor (MOS) transistor including a first current electrode coupled to the second terminal of the first resistive element, a second current electrode coupled to a third supply voltage and a gate electrode coupled to the output signal of the second RC filter; and a second MOS transistor including a first current electrode coupled to the second terminal of the resistive element, a second current electrode coupled to the third supply voltage and a gate electrode coupled to the output signal of the first RC filter; and the inverter includes a third MOS transistor having a first current electrode coupled to the second supply voltage, a second current electrode coupled to a first terminal of a second ballast element, and a gate electrode coupled to the first current electrodes of the first and second MOS transistors; and the second resistive element includes a second terminal coupled to the third supply voltage. In another aspect, the combinatorial logic circuit further includes a first inverter including an input coupled to the output signal of the first RC filter; a second inverter including an input coupled to the output signal of the second RC filter; and a NAND gate that generates an output signal to activate the rail clamp device, wherein the NAND gate includes a first input configured to receive an output signal from the first inverter, and a second input configured to receive an output signal from the second inverter. In a further aspect, the first inverter includes a first ballast element coupled in series with a first MOS transistor between the first supply voltage and ground, wherein a gate electrode of the first MOS transistor is coupled to the first output signal, and the second inverter includes a second ballast element coupled in series with a second MOS transistor between the second supply voltage and ground, wherein a gate electrode of the second MOS transistor is coupled to the second output signal; the NAND gate includes: a third inverter including a third ballast element coupled in series with a third MOS transistor between the first supply voltage and ground, wherein a gate electrode of the third MOS transistor is coupled to the output signal from the first inverter, and the fourth inverter includes a fourth ballast element coupled in series with a fourth MOS transistor between the second supply voltage and ground, wherein a gate electrode of the fourth MOS transistor is coupled to the output signal from the second inverter.

What is claimed is:

1. A method comprising:
   detecting a first type of electrical stress event with a first detection circuit in a trigger circuit, wherein the first detection circuit is coupled to a first supply voltage;
   when the first type of electrical stress event is detected, activating a rail clamp device to protect an integrated circuit from the first type of transient electrical stress event;
   detecting a second type of electrical stress event with a second detection circuit in the trigger circuit, wherein the second detection circuit is coupled to a second supply voltage; and
   when the second type of electrical event is detected, activating the rail clamp device to protect the integrated circuit from the second type of transient electrical stress event.

2. The method of claim 1 further comprising:
   generating an output signal with a combinatorial logic circuit coupled to receive input from the first and second detection circuits, and to provide the output signal to activate the rail clamp device based on the input from the first and second detection circuits.

3. The method of claim 1 further comprising:
   receiving an output signal from the first detection circuit at an input to a NOR gate;
   receiving an output signal from the second detection circuit at another input to the NOR gate;
   receiving an output signal from the NOR gate at an input to an inverter;
   activating the rail clamp device with an output of the inverter.

4. The method of claim 1 further comprising:
   receiving an output signal from the first detection circuit at an input to a first inverter;
   receiving an output signal from the second detection circuit at an input to a second inverter;
   receiving an output signal from the first inverter at an input to a NAND gate;
   receiving an output signal from the second inverter at another input to the NAND gate;
   activating the rail clamp device with an output of the NAND gate.

* * * * *